(12) United States Patent
Mohammed et al.

(10) Patent No.: US 9,070,849 B2
(45) Date of Patent: Jun. 30, 2015

(54) PARALLEL PLATE SLOT EMISSION ARRAY

(71) Applicant: Invensas Corporation, San Jose, CA (US)

(72) Inventors: Ilyas Mohammed, Santa Clara, CA (US); Liang Wang, Milpitas, CA (US); Steven D. Gottke, Palo Alto, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/058,141

(22) Filed: Oct. 18, 2013

(65) Prior Publication Data

US 2014/0045285 A1    Feb. 13, 2014

Related U.S. Application Data

(62) Division of application No. 13/543,697, filed on Jul. 6, 2012, now Pat. No. 8,664,681.

(51) Int. Cl.
| | |
|---|---|
| *H01L 33/60* | (2010.01) |
| *H01L 27/15* | (2006.01) |
| *H01L 25/075* | (2006.01) |
| *H01L 33/62* | (2010.01) |

(52) U.S. Cl.
CPC .............. *H01L 33/60* (2013.01); *H01L 27/156* (2013.01); *H01L 25/0753* (2013.01); *H01L 33/62* (2013.01); *H01L 2933/0066* (2013.01); *H01L 2224/48463* (2013.01); *H01L 2224/73265* (2013.01); *H01L 2224/8592* (2013.01); *H01L 2924/19107* (2013.01)

(58) Field of Classification Search
CPC ....... H01L 33/60; H01L 33/62; H01L 27/156; H01L 25/0753; H01L 2933/0066

USPC ................................ 438/27, 29; 257/E33.072
See application file for complete search history.

(56) References Cited

U.S. PATENT DOCUMENTS

| | | | | |
|---|---|---|---|---|
| 7,317,211 B2* | 1/2008 | Watanabe et al. | ............... | 257/98 |
| 7,858,994 B2* | 12/2010 | Daniels | ........................... | 257/88 |
| 7,932,113 B1* | 4/2011 | Yee et al. | ........................ | 438/35 |
| 7,952,107 B2* | 5/2011 | Daniels et al. | .................. | 257/80 |
| 8,129,730 B2* | 3/2012 | Daniels | ........................... | 257/88 |

(Continued)

FOREIGN PATENT DOCUMENTS

| | | |
|---|---|---|
| WO | 2012039555 A2 | 3/2012 |
| WO | 2012091042 A1 | 7/2012 |

OTHER PUBLICATIONS

PCT International Search Report and Written Opinion dated Feb. 11, 2014; International Application No. PCT/US2013/073849; ISA/EPO.

(Continued)

*Primary Examiner* — Mary Wilczewski

(57) ABSTRACT

In accordance with an embodiment of the present invention, an article of manufacture includes a side-emitting light emitting diode configured to emit light from more than two surfaces. The article of manufacture includes a first sheet electrically and thermally coupled to a first side of the light emitting diode, and a second sheet electrically and thermally coupled to a second side of the light emitting diode. The article of manufacture further includes a plurality of reflective surfaces configured to reflect light from all of the surfaces of the light emitting diode through holes in the first sheet. The light may be reflected via total internal reflection.

21 Claims, 20 Drawing Sheets

(56) References Cited

U.S. PATENT DOCUMENTS

| | | | |
|---|---|---|---|
| 8,210,716 B2* | 7/2012 | Lerman et al. | 257/88 |
| 8,242,518 B2* | 8/2012 | Lerman et al. | 257/88 |
| 8,461,602 B2* | 6/2013 | Lerman et al. | 257/88 |
| 8,604,463 B2* | 12/2013 | Kwon et al. | 257/40 |
| 8,664,681 B2* | 3/2014 | Mohammed et al. | 257/98 |
| 2003/0160258 A1* | 8/2003 | Oohata | 257/99 |
| 2004/0195576 A1* | 10/2004 | Watanabe et al. | 257/79 |
| 2004/0259282 A1* | 12/2004 | Oohata | 438/34 |
| 2007/0090387 A1* | 4/2007 | Daniels et al. | 257/99 |
| 2007/0145892 A1* | 6/2007 | Chen | 313/506 |
| 2007/0290217 A1* | 12/2007 | Daniels | 257/88 |
| 2009/0261357 A1* | 10/2009 | Daniels | 257/88 |
| 2010/0019668 A1* | 1/2010 | Koo | 313/504 |
| 2010/0084665 A1* | 4/2010 | Daniels et al. | 257/88 |
| 2011/0012164 A1 | 1/2011 | Kim | |
| 2011/0068359 A1 | 3/2011 | Yahata et al. | |
| 2011/0111542 A1* | 5/2011 | Yee et al. | 438/35 |
| 2011/0193105 A1* | 8/2011 | Lerman et al. | 257/88 |
| 2011/0198631 A1* | 8/2011 | Lerman et al. | 257/91 |
| 2011/0204391 A1* | 8/2011 | Lerman et al. | 257/88 |
| 2011/0242433 A1* | 10/2011 | Yamasaki et al. | 348/739 |
| 2012/0250319 A1* | 10/2012 | Dau et al. | 362/244 |
| 2012/0268932 A1* | 10/2012 | Lerman et al. | 362/235 |
| 2013/0135258 A1* | 5/2013 | King et al. | 345/175 |
| 2013/0277696 A1 | 10/2013 | Matsui et al. | |
| 2014/0008669 A1* | 1/2014 | Mohammed et al. | 257/88 |
| 2014/0045285 A1* | 2/2014 | Mohammed et al. | 438/27 |
| 2014/0124749 A1* | 5/2014 | Kim et al. | 257/40 |
| 2014/0334137 A1* | 11/2014 | Hasenoehrl et al. | 362/147 |

OTHER PUBLICATIONS

Shanks, H., et al.; Thermal Conductivity of Silicon From 300 to 1400° K; Physical Review; vol. 130, No. 5; Jun. 1, 1963; pp. 1743-1748; XP055099700.

* cited by examiner

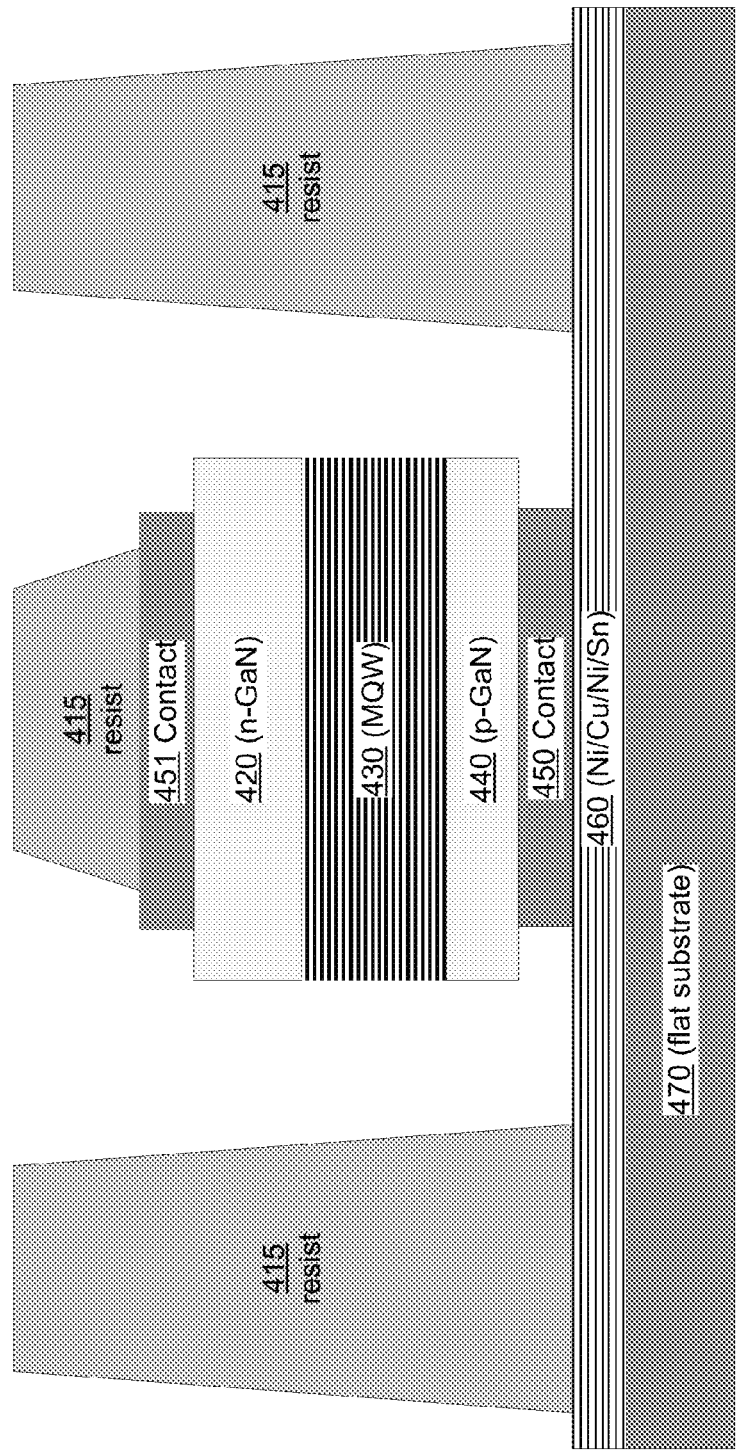

PARALLEL PLATE SLOT EMISSION ARRAY

RELATED APPLICATION

This application is a Divisional application of co-pending, commonly-owned U.S. patent application Ser. No. 13/543,697, entitled, "Parallel Plate Slot Emission Array," filed Jul. 6, 2012, to Mohammed et al., which is hereby incorporated herein by reference in its entirety.

FIELD OF INVENTION

Embodiments of the present invention relate to the field of integrated circuit design and manufacture. More specifically, embodiments of the present invention relate to systems and methods for parallel plate slot emission arrays.

BACKGROUND

Conventional packaging of high-power light emitting diodes (LEDs) is considered to be expensive, and is considered to perform poorly in the areas of thermal management and electrical field distribution. In addition, conventional packaging may lead to a degradation of phosphor.

SUMMARY OF THE INVENTION

Therefore, what is needed are systems and methods for parallel plate slot emission arrays. What is additionally needed are systems and methods for parallel plate slot emission arrays that provide for improved thermal management. An additional need is for systems and methods for parallel plate slot emission arrays that provide for improved electrical field distribution. A further need exists for systems and methods for parallel plate slot emission arrays that are compatible and complementary with existing systems and methods of integrated circuit design, manufacturing and test. Embodiments of the present invention provide these advantages.

In accordance with a first embodiment of the present invention, an article of manufacture includes a side-emitting light emitting diode configured to emit light from more than two surfaces. The article of manufacture includes a first sheet electrically and thermally coupled to a first side of the light emitting diode, and a second sheet electrically and thermally coupled to a second side of the light emitting diode. The article of manufacture further includes a plurality of reflective surfaces configured to reflect light from all of the surfaces of the light emitting diode through holes in the first sheet. The light may be reflected via total internal reflection.

In accordance with another embodiment of the present invention, an article of manufacture includes a side-emitting light emitting diode. The article of manufacture also includes a first sheet electrically and thermally coupled to a first side of the light emitting diode and a second sheet electrically and thermally coupled to a second side of the light emitting diode. The plurality of reflective surfaces, located between the first and second sheets, is configured to reflect light from the light emitting diode. The light may be reflected via total internal reflection.

In accordance with a method embodiment of the present invention, a plurality of side-emitting light emitting diodes is attached to a first plate and the plurality of side-emitting light emitting diodes is attached to a second plate. A pattern of reflective surfaces is created between the first and second plates. The reflective surfaces are configured to reflect light from the plurality of side-emitting light emitting diodes perpendicular to the plates. A transparent dielectric may be added between the first and second plate. An interface between the pattern of reflective surfaces and the transparent dielectric may be configured to cause total internal reflection of the light.

In accordance with another method embodiment of the present invention, a light emitting diode is formed structure on a substrate. Portions of the light emitting diode structure are etched to form a plurality of individual light emitting diode devices. A first contact layer is formed on the top of the plurality of individual light emitting diode devices. A second contact layer is formed on a flat substrate. The second contact layer is attached to the first contact layer. The substrate is removed from the plurality of individual light emitting diode devices. A third contact layer is formed opposite the first contact layer on the plurality of individual light emitting diode devices. A first photoresist is patterned onto the third contact. A second photoresist is patterned in regions between the plurality of individual light emitting diode devices. Regions between the plurality of individual light emitting diode devices and the second photoresist are filled with a transparent dielectric material.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings are not drawn to scale.

FIGS. 4A, 4B, 4C, 4D, 4E, 4F, 4G, 4H, 4I, 4J, 4K, 4L, 4M and 4N illustrate exemplary sub-assemblies of, and an exemplary process for forming a parallel plate slot emission array, in accordance with embodiments of the present invention.

DETAILED DESCRIPTION

Figure 1A:
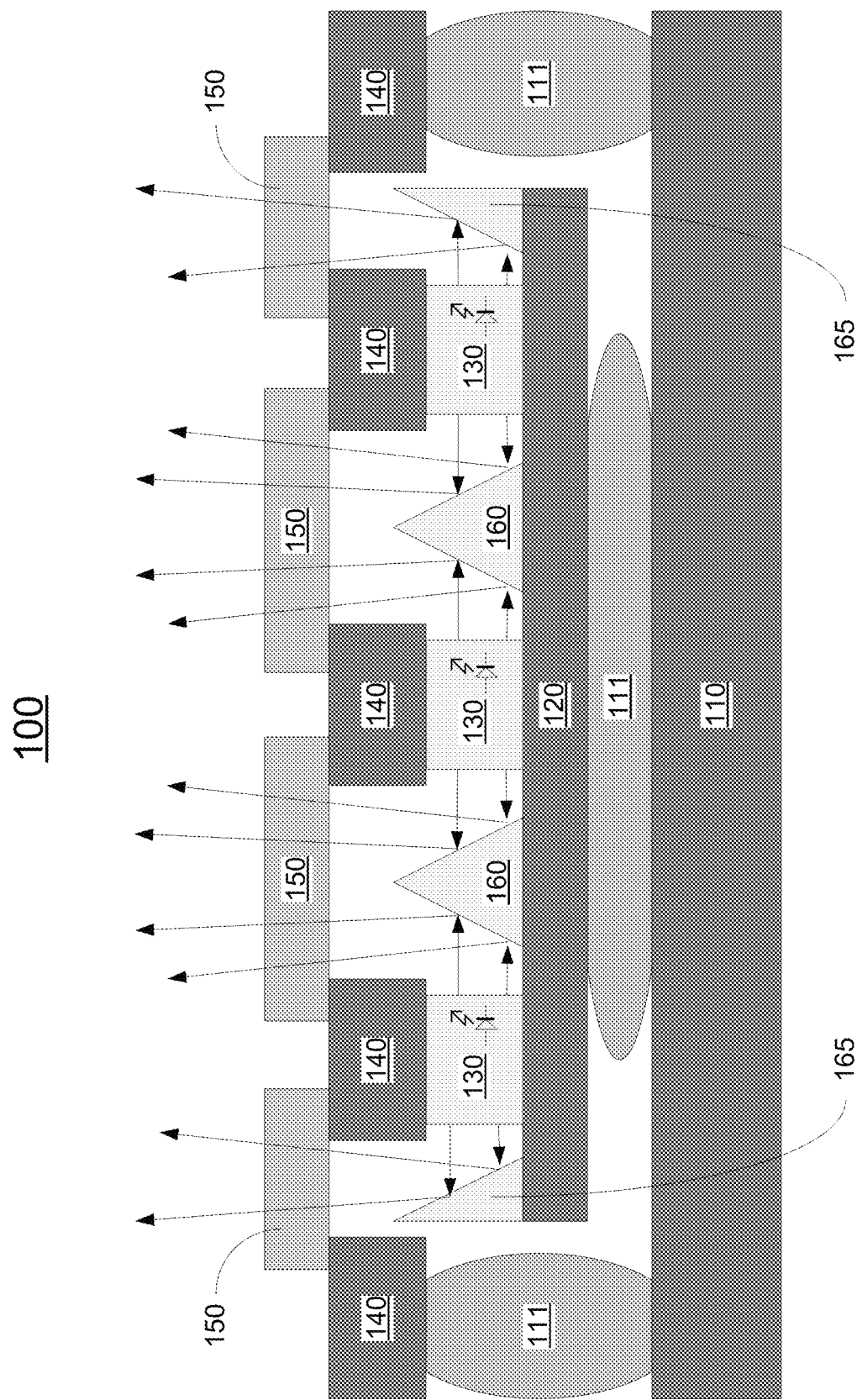
FIG. 1A illustrates a side sectional view of an exemplary parallel plate slot emission array, in accordance with embodiments of the present invention.

Reference will now be made in detail to various embodiments of the present invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

NOTATION AND NOMENCLATURE

Some portions of the detailed descriptions which follow (e.g., process 400) are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "attaching" or "processing" or "singulating" or "processing" or "forming" or "roughening" or "filling" or "accessing" or "performing" or "generating" or "adjusting" or "creating" or "executing" or "continuing" or "indexing" or "processing" or "computing" or "translating" or "calculating" or "determining" or "measuring" or "gathering" or "running" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Parallel Plate Slot Emission Array

Figure 2A:
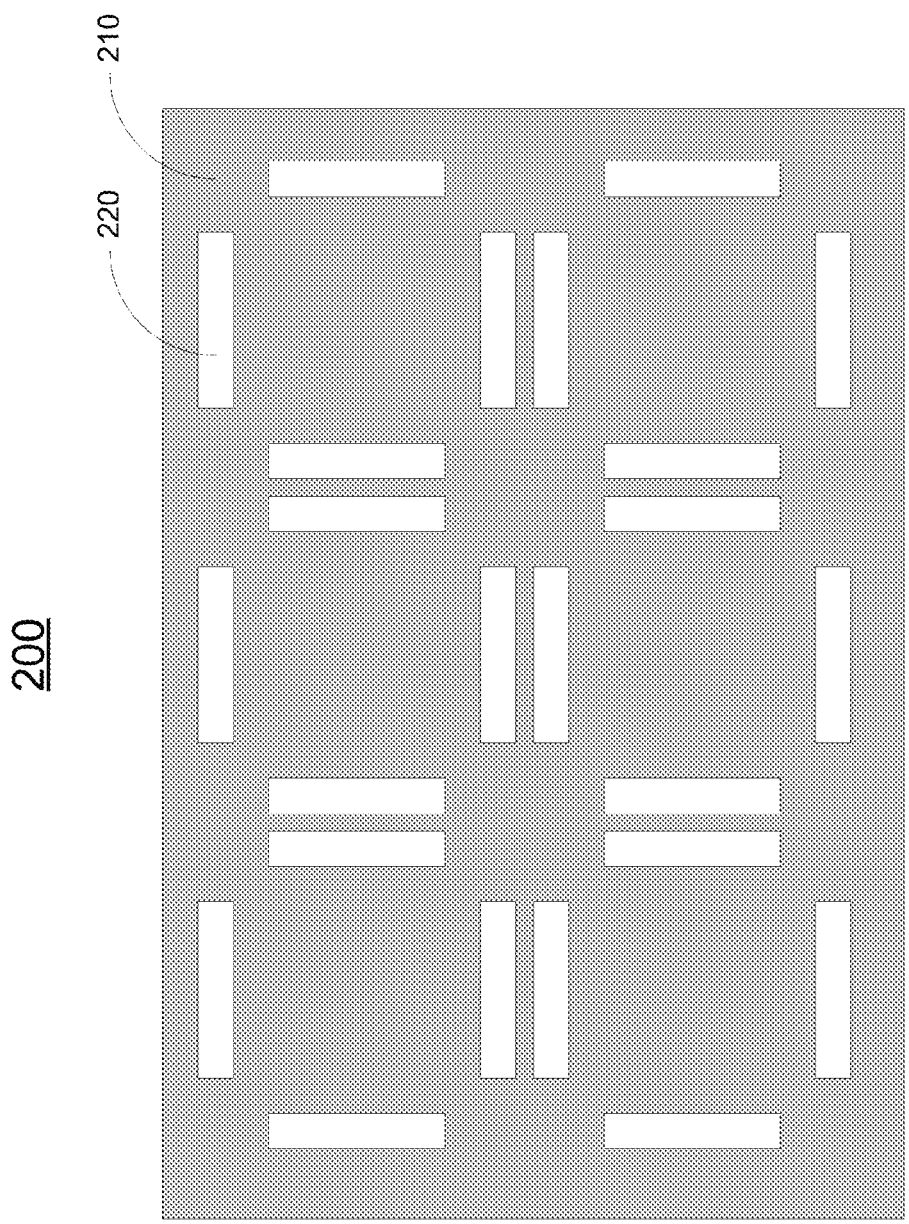
FIG. 2A illustrates a first sub-assembly as used in an exemplary process of forming a parallel plate slot emission array, in accordance with embodiments of the present invention.
Figure 2B:
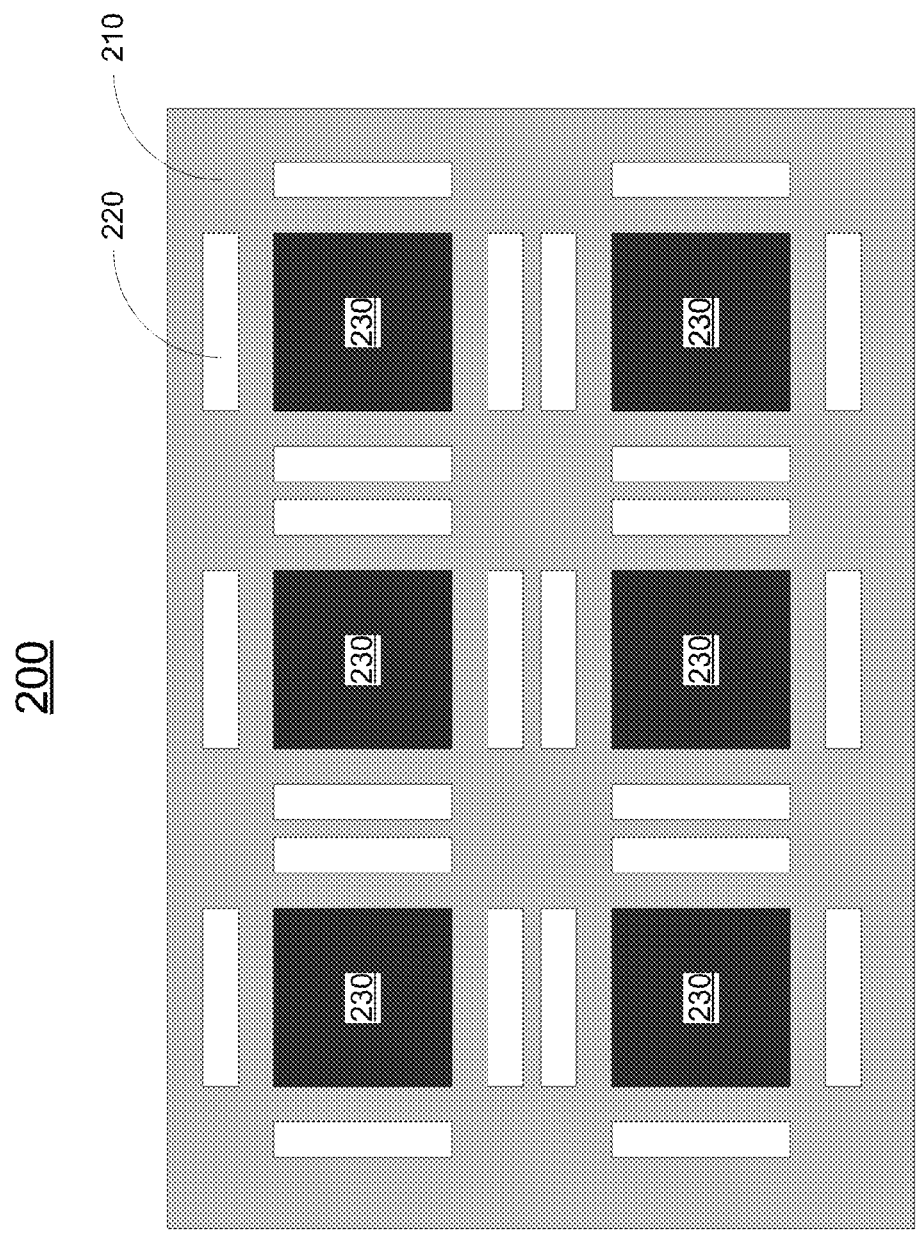
FIG. 2B illustrates a placement and attachment of light emitting diode devices to a plate, in accordance with embodiments of the present invention.
Figure 3:
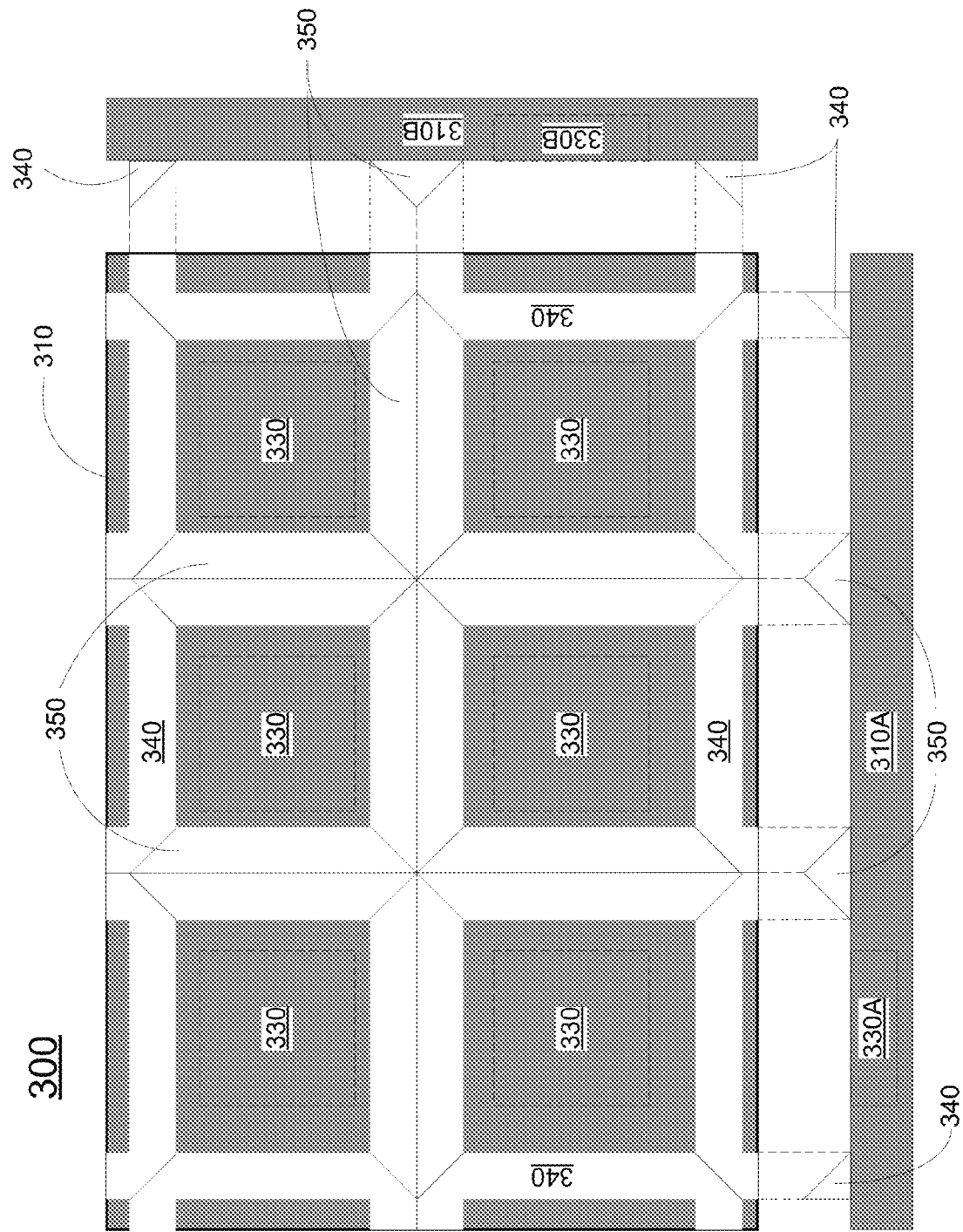
FIG. 3 illustrates a second sub-assembly as used in an exemplary process of forming a parallel plate slot emission array, in accordance with embodiments of the present invention.

FIG. 1A illustrates a side sectional view of an exemplary parallel plate slot emission array 100, in accordance with embodiments of the present invention. It is to be appreciated that parallel plate slot emission array 100 does not have a consistent section throughout. FIGS. 2A, 2B and 3, further described below, further illustrate characteristics of array 100, including in regions dissimilar to that of the section illustrated in FIG. 1A.

Parallel plate slot emission array 100 is illustrated mounted to an exemplary second level substrate 110 via solder 111. In addition to providing structural support, a second level substrate may typically provide electrical signals, e.g., power, ground and/or control. Second level substrate 110 may comprise any suitable mounting substrate, e.g., a printed wiring board, e.g., FR4, multi-chip module substrates, e.g., multilayer ceramic (MLC), thick-film hybrids, liquid polyimide, organic substrates and the like. Exemplary second level substrate 110 may also accept heat from the light emitting diodes 130.

Sheet 120 is configured to accept light emitting diodes 130. Sheet 120 may also function as a physical foundation for reflectors 160 and 165, described further below. Sheet 120 should be thermally conductive and may be optically opaque. Sheet 120 may be electrically conductive, or comprise electrical conductors, to provide electrical signals, e.g., power, ground and/or control, to light emitting diodes 130, but that is not required. As illustrated, sheet 120 is configured to provide electrical signal(s), e.g., power or ground, to light emitting diodes 130. Sheet 120 is also configured to conduct heat away from light emitting diodes 130. In some embodiments, sheet 120 may comprise a metal sheet.

Light emitting diodes 130 are side-emitting devices, and may be any suitable design and/or emission spectra, for example, light emitting diodes 130 may be multiple quantum well (MQW) devices. The light emitting diodes 130 may be of the same or dissimilar design. For example, a first instance of light emitting diodes 130 may emit red light, a second instance of light emitting diodes 130 may emit green light, while a third instance of light emitting diodes 130 may emit blue light.

Reflectors 160 are located to the sides of light emitting diodes 130, and serve to redirect the side-emitted light in a generally upward (in the view of FIG. 1A) direction. Reflectors 160 may be any suitable shape, and may be symmetrical about a vertical (in the view of FIG. 1A) axis. Reflectors 160 may accept light from a variety of angles, e.g., within a range of incident angles. Likewise, reflectors 160 may disburse reflected light. For example, substantially parallel incident light may be reflected such that such light is reflected at different angles across a reflective face of reflectors 160. Reflectors 160 may be rough, at optical dimensions, so as to increase disburse distribution of reflected light, but that is not required. Reflectors 165 are substantially similar to reflectors 160, except that they may have a single reflective surface. For example, reflectors 165 may be suitable when light emitting diodes are located on only one side of reflectors 165.

It is to be appreciated that reflectors 160 and 165 may be generally triangular or trapezoidal, although that it not required. For example, the surfaces of reflectors 160 and 165 may be curved, either by design or as a result of processing.

Sheet 140 is substantially similar to sheet 120. Sheet 140 may comprise a substrate on which light emitting diodes 130 were formed, but that is not required. Sheet 140 comprises gaps or slots between light emitting diodes 130, e.g., above reflectors 160 and 165, to enable light to escape. Sheet 140 should be thermally conductive and may be optically opaque. Sheet 140 may be electrically conductive, or comprise electrical conductors, to provide electrical signals, e.g., power, ground and/or control, to light emitting diodes 130, but that is not required. In some embodiments, sheet 140 may comprise a metal sheet. In alternative embodiments, sheet 140 may be formed by plating or other deposition.

Optional windows 150 cover the gaps in sheet 140. Windows 150 may comprise a lens and/or phosphor. For example, windows 150 may help match refractive indexes for to improve light extraction, and may facilitate mixing of different light frequencies. In addition, windows 150 comprising a phosphor may enable generation of optical frequencies and/or mixtures that are unavailable from light emitting diodes 130. For example, some of light emitting diodes 130 may emit short-wavelength light, which is converted, e.g., via phosphorescence or fluorescence, to white light by such phosphor(s).

A volume between windows 150 and sheet 120, or features mounted on or above sheet 120, may be filled with a transparent material, e.g., a transparent dielectric material, in some embodiments.

In an exemplary embodiment, first terminals of light emitting diode devices 130 are coupled to sheet 120, and second terminals of light emitting diode devices 130 are coupled to sheet 140. The first terminals of light emitting diode devices 130 are coupled to second level substrate 110 via sheet 120 and solder 111. The second terminals of light emitting diode devices 130 are coupled to second level substrate 110 via sheet 140, including portions of sheet 140 out of the plane of FIG. 1A, and solder 111. Such coupling paths may also conduct thermal energy away from light emitting diode devices 130.

It is to be appreciated that substantially the entire "bottom" of the light emitting diode devices 130 are coupled to sheet 120, and substantially the entire "top" of the light emitting diode devices 130 are coupled to sheet 140, in accordance with embodiments of the present invention. This novel arrangement enables greater heat extraction from the light emitting diode devices 130, in comparison to the conventional art. In addition, this novel arrangement enables a lower electrical resistance and a more uniform distribution of an electric field between the conductors of sheets 120 and 140 and light emitting diode devices 130.

It is to be further appreciated that exemplary parallel plate slot emission array 100 is a three-dimensional structure, and extends above and below the plane of FIG. 1A. For example, a side sectional view of exemplary parallel plate slot emission array 100 perpendicular to the plane of FIG. 1A would be substantially identical to FIG. 1A. As will be further described below, reflectors 160 and 165 surround the light emitting diodes 130 on all sides, reflecting light emitting from all sides of the diodes 130.

Figure 1B:
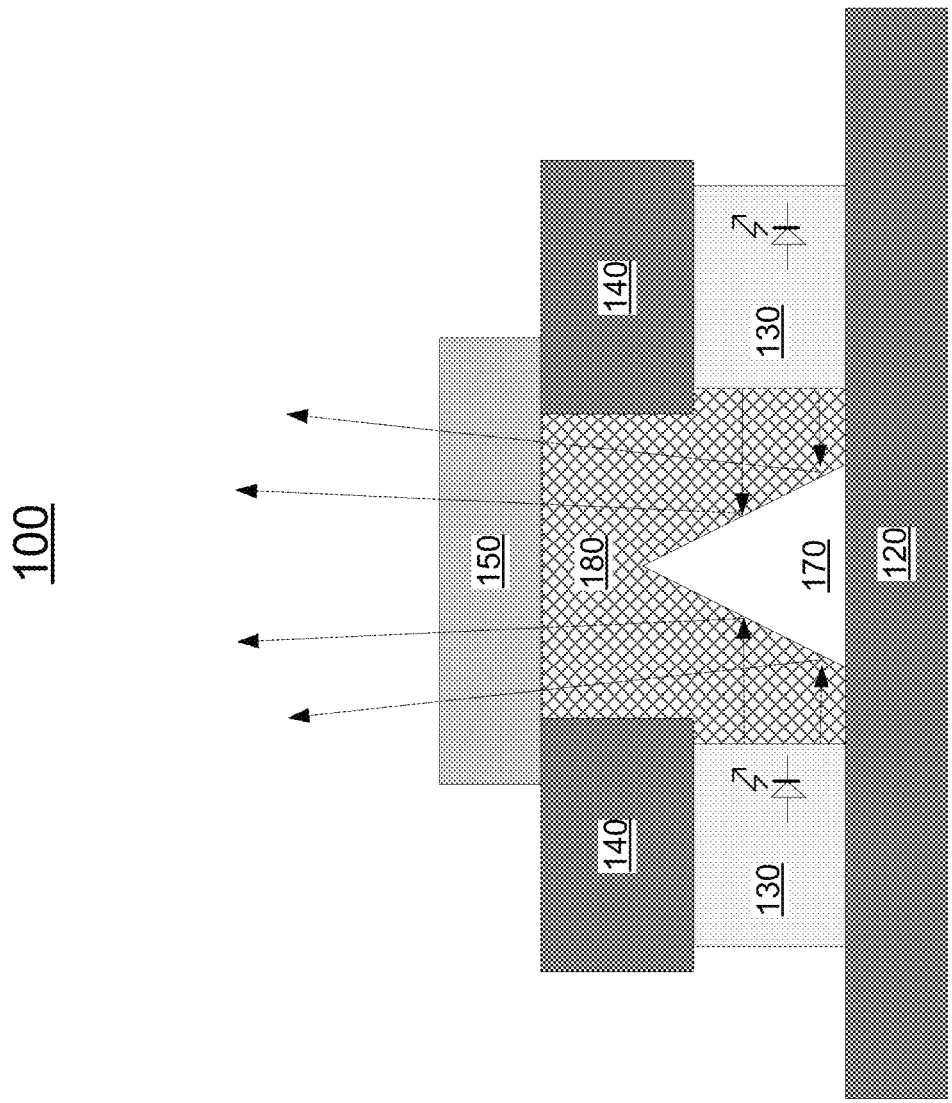
FIG. 1B illustrates a side sectional view of an exemplary parallel plate slot emission array, in accordance with embodiments of the present invention.

FIG. 1B illustrates a side sectional view of an exemplary parallel plate slot emission array 100, in accordance with embodiments of the present invention. In the embodiment of FIG. 1B, the light emitted from the light emitting diodes 130 is reflected upwards via total internal reflection.

In the embodiment of FIG. 1B, a volume between windows 150 and sheet 120 is filled with a transparent material 180 of relatively high refractive index, n2. It is to be appreciated that material 180 does not need to fill the entire volume between windows 150 and sheet 120. For example, material 180 may fill from sheet 120 to the location of light emission from light emitting diodes 130. A volume 170 comprises a transparent material of relatively lower refractive index, n1. Volume 170 may be a void, e.g., comprising air or a substantial vacuum, and may generally form a triangle or trapezoid, although that is not required. The refractive indices of a transparent material 180, n2, and volume 170, n1, are related in such a manner that total internal reflection can occur at the interface between the two materials.

For example, if volume 170 is a void, e.g., air, n1 is equal to 1.0, and the refractive index of a transparent material 180, n2 may be 1.5 or greater. Suitable materials for 180 include, for example, the group of optical grade materials such as acrylic resins, polycarbonate, PMMA (Poly(methyl methacrylate)), epoxies, silica, polyimide, glass, and fluoride glasses such as fluorozirconate and fluoroaluminate. It is appreciated that other materials may also be suitable. In such a case, the critical angle for the internal reflection is arcsine (n1/n2) equals arcsine (1/1.5) or about 41.8 degrees, which requires the bottom angle of the volume 170 to be about 48.2 degrees or smaller to reflect all or most of the cone of light emitted from diodes 130.

Alternatively, material 180 may be chosen with a higher refractive index, e.g., n2 is greater than or equal to about 1.77. Suitable exemplary materials include, for example, aluminum oxide ($Al_2O_3$), hafnia ($HfO_2$), zinc oxide (ZnO), molybdenum trioxide ($MoO_3$), silicon nitride ($Si_3N_4$), zirconia ($ZrO_2$), potassium niobate ($KNbO_3$), lithium niobate ($LiNbO_3$), niobium pentoxide ($Nb_2O_5$), zinc sulfide (ZnS), strontium titanate ($SrTiO_3$), titanium dioxide ($TiO_2$), cadmium indate ($CdIn_2O_4$), and chalcogenides. It is appreciated that other materials may also be suitable. The use of such materials may enable a larger bottom angle of the volume 170, e.g., up to about 70.5 degrees if chalcogenides (n=3.0) are applied.

In accordance with other embodiments of the present invention, volume 170 may comprise a non-void structure with an index of refraction greater than 1.0. In an exemplary embodiment, n1 may be 1.5 and n2 may be greater than or equal to 2.25. Exemplary materials with a refractive index of about 1.5 are listed above. Suitable exemplary materials with a refractive index of 2.25 or greater include, for example, potassium niobate ($KNbO_3$), lithium niobate ($LiNbO_3$), $Nb_2O_5$, ZnS, $SrTiO_3$, $TiO_2$, cadmium indate ($CdIn_2O_4$), and chalcogenides. It is appreciated that other materials may also be suitable.

In general, an inverse slope profile needed for the volume 170 may be achieved on a negative tone photoresist or image-reversal treated positive-tone photoresist. Upon changing focus and exposure dose (UV intensity and exposure time) relative to the photoresist thickness and its photosensitivity, the profile angle (between side wall and top surface) of photoresist can be changed.

In this novel manner, light from the side-emitting light emitting diodes may be captured and redirected, via a mechanism of total internal reflection, with high efficiency.

FIG. 2A illustrates a first sub-assembly 200 as used in an exemplary process of forming a parallel plate slot emission array, in accordance with embodiments of the present invention. Assembly 200 comprises plate 210, shown in plan view. Plate 210 may comprise metal, and may be a metal plate. Plate 210 should be thermally conductive. Plate 210 may be electrically conductive, or comprise electrical conductors, e.g., on its surface, to provide electrical signals, e.g., power, ground and/or control, to light emitting diodes 130, but that is not required. Plate 210 may have a thickness of about 25 to 250 μm, in some embodiments.

A pattern of slots 220 is formed in plate 210. Slots 220 may be formed by any suitable process, including, for example, die cutting or punching, laser scribing, and/or lithographic processing. As will be further described below, slots 220 will surround light emitting diode devices and enable light to escape from a parallel plate slot emission array. In some embodiments, slots 220 may be about 30 to 40 μm in width.

FIG. 2B illustrates a placement and attachment of light emitting diode devices 230 to plate 210, in accordance with embodiments of the present invention. A crystal-seed substrate, e.g., sapphire (α-$Al_2O_3$), may be removed from the light emitting diode devices prior to or subsequent to that attachment. For example, many light emitting diode devices are formed on a sapphire substrate. However, the sapphire plays no part in the operation of the light emitting diode device. Further, sapphire is a relatively poor thermal conductor. Accordingly, removing the sapphire may improve the thermal efficiency of a parallel plate slot emission array, in accordance with embodiments of the present invention.

FIG. 3 illustrates a second sub-assembly 300 as used in an exemplary process of forming a parallel plate slot emission array, in accordance with embodiments of the present invention. Sub-assembly 300 comprises a plate 310. Plate 310 should be a good thermal conductor, and may comprise metal, silicon (Si), ceramics or the like. Plate 310 may be electrically conductive. If formed from a non conductor, e.g., silicon (Si) or ceramics, a conductive coating may be provided, in accordance with embodiments of the present invention.

A pattern of reflective or "mirrored" ribs 340 and 350 are formed on plate 310. Side views 310A and 310B further illustrate ribs 340 and 350. Ribs 340 have a single reflective surface, while ribs 350 have two opposing reflective surfaces. The intersections of ribs 350 and 350 with ribs 340 may form corners as illustrated, but that is not required.

In accordance with alternative embodiments of the present invention, ribs 340 and/or 350 may be mandrels that are removed during manufacturing, e.g., after filling a volume between plates 210 and 310 with a transparent dielectric material. Removal of such mandrels may leave a void structure, as described with respect to FIG. 1B.

Reflective ribs 340 and 350 may be formed by a variety of processes, such as mechanically molding metal sheets, wet etching metal sheets after photolithographic patterning, plating metal in the triangular/trapezoidal spacing formed between inverse-slope profiled photoresist (negative tone photoresist or image-reversal treated positive-tone photoresist), or alkaline etching of crystalline silicon using potassium hydroxide (KOH), tetramethyl ammonium hydroxide (TMAH) or ethylenediamene pyrocatecol (EDP) by taking advantage of an anisotropic etch rate along different orientation of the silicon's crystal planes.

Plate 310 further comprises locations 330, between ribs 350 and 340. Locations 330 are configured to accept light emitting diode devices 230 (FIG. 2B). Locations 330 may be recessed in some embodiments, as illustrated in side views 310A and 310B, but that is not required.

Sub-assembly 300 is bonded to sub-assembly 200 using any suitable bonding techniques and/or materials, including adhesive bonding. The resulting structure substantially corresponds to elements of parallel plate slot emission array 100, as illustrated in FIG. 1A. For example, sub-assembly 200 (FIG. 2A) generally corresponds to sheet 140 (FIG. 1A). The slots 220 in plate 210 (FIG. 2A) generally correspond to the gaps between portions of sheet 140, e.g., under windows 150, shown in FIG. 1A. Similarly, sub-assembly 300 (FIG. 3), comprising reflective ribs 350, 340, generally corresponds to sheet 120, comprising reflectors 160 and 165, respectively, of FIG. 1A.

It is to be appreciated that the shape and arrangement of slots 220 (FIG. 2A), locations 330, and ribs 340 and 350 (FIG. 3) are exemplary, and not limiting. These shapes may correspond to a shape of light emitting diode devices 230 (FIG. 2B). Light emitting diode devices 230 may advantageously have any suitable shape, e.g., square, hexagonal, octagonal and the like, in accordance with embodiments of the present invention.

Figure 4A:
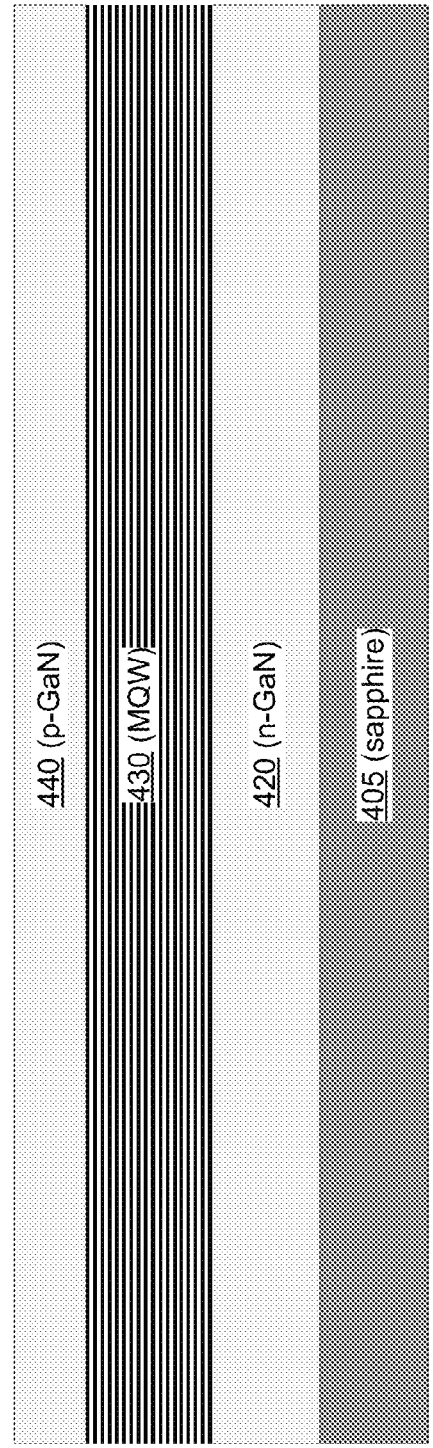
Figure 4B:
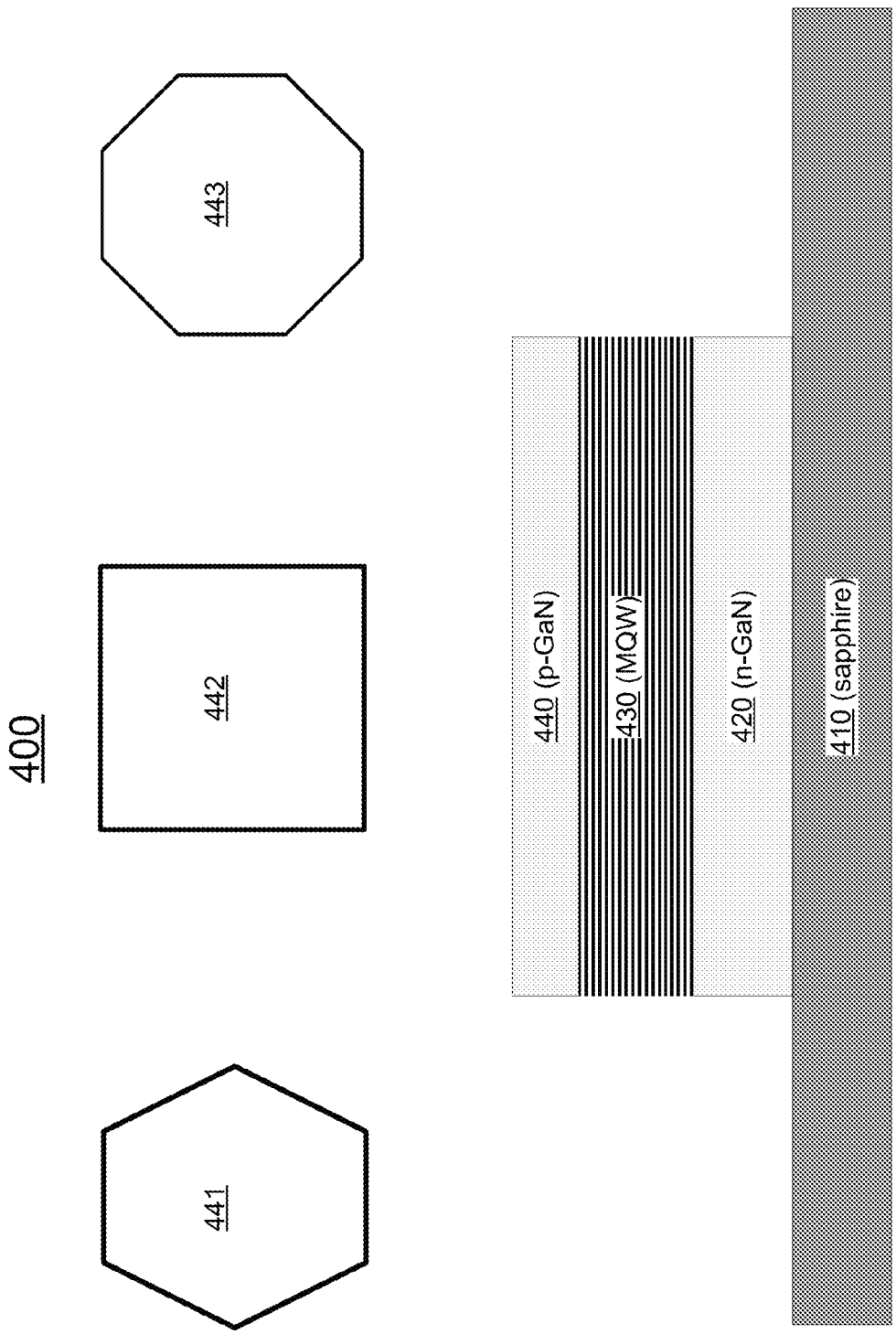
Figure 4C:
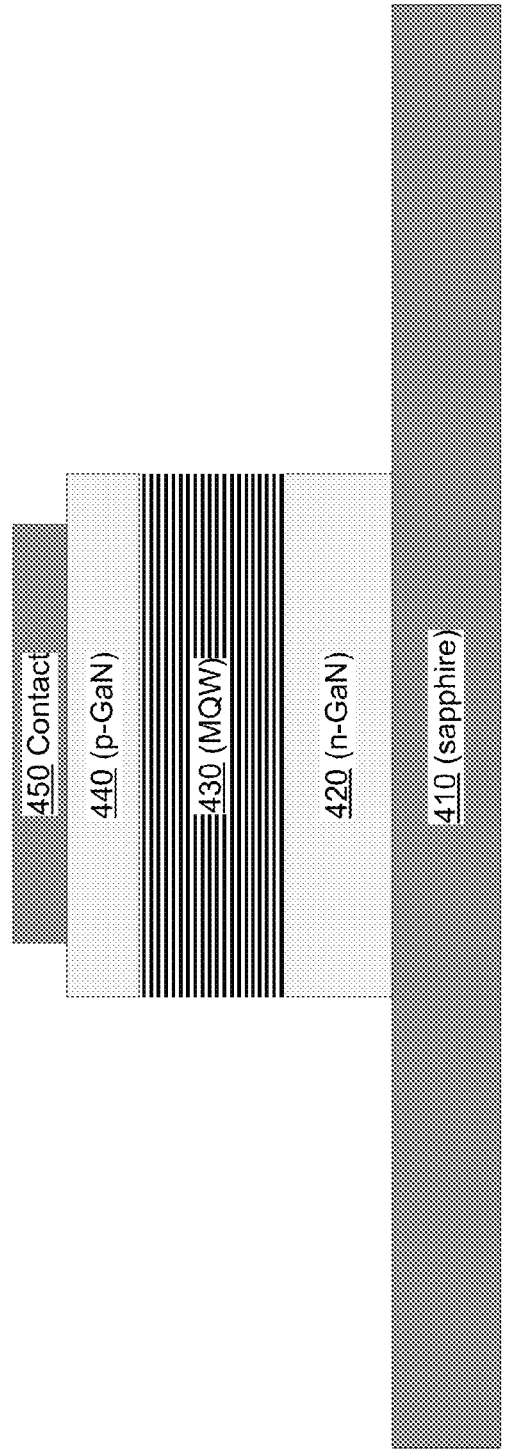
Figure 4D:
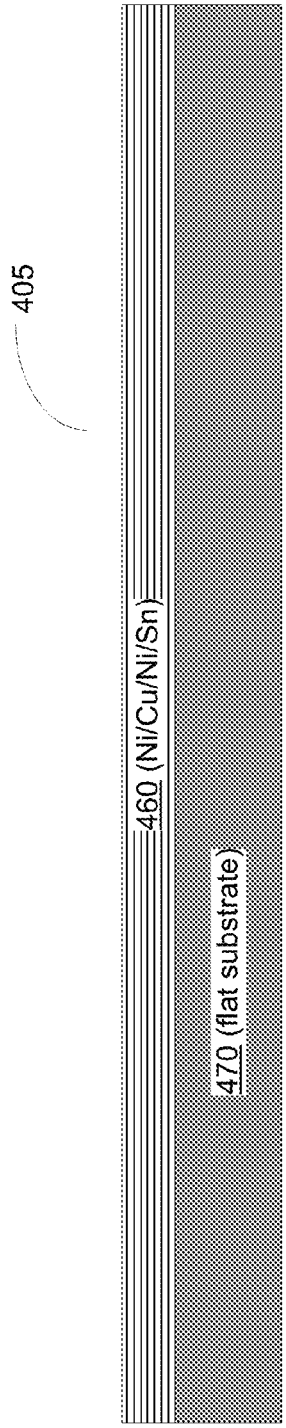
Figure 4E:
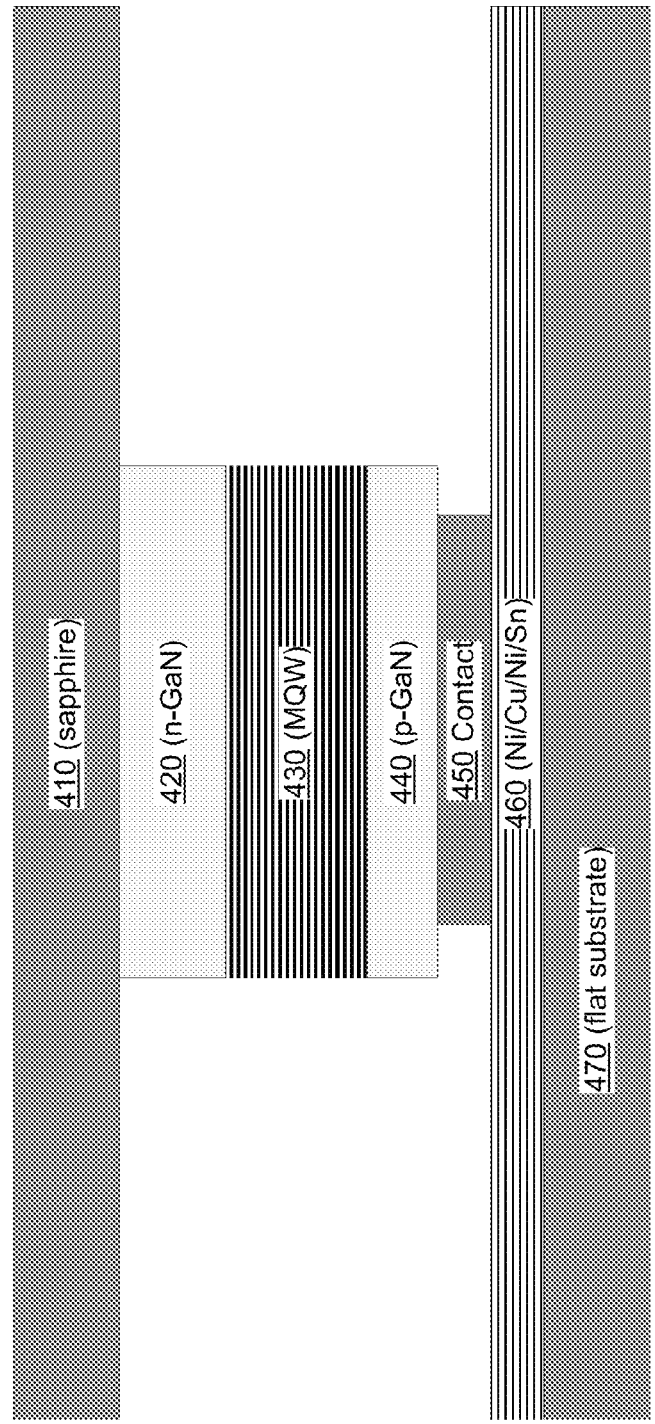
Figure 4F:
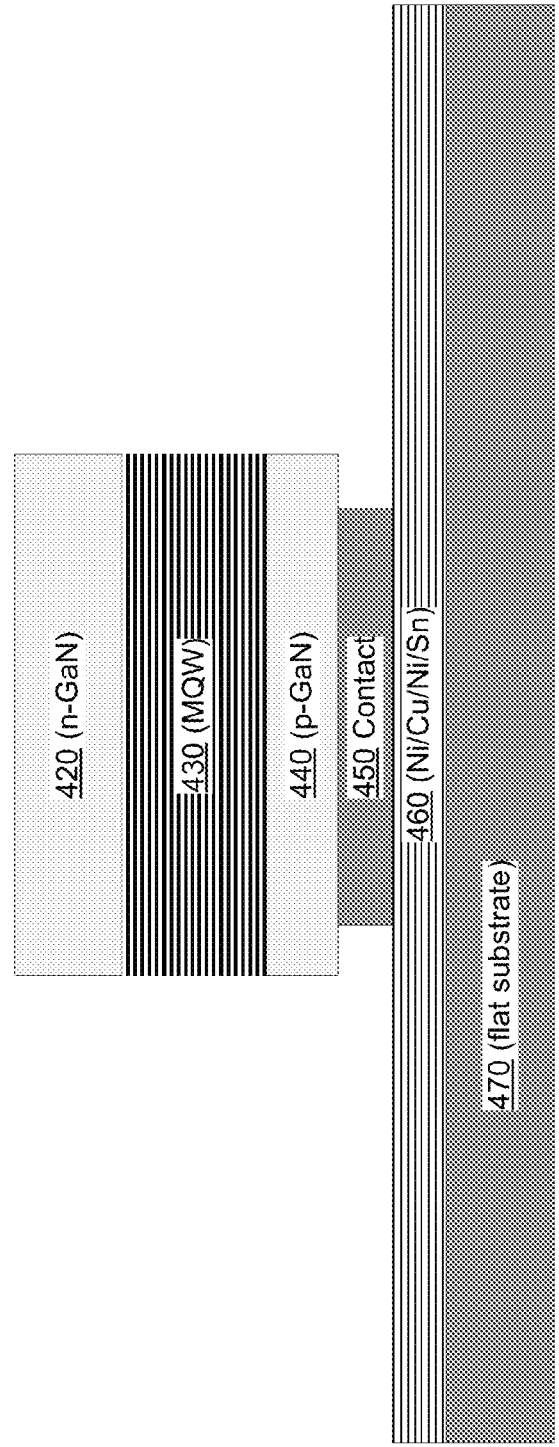
Figure 4G:
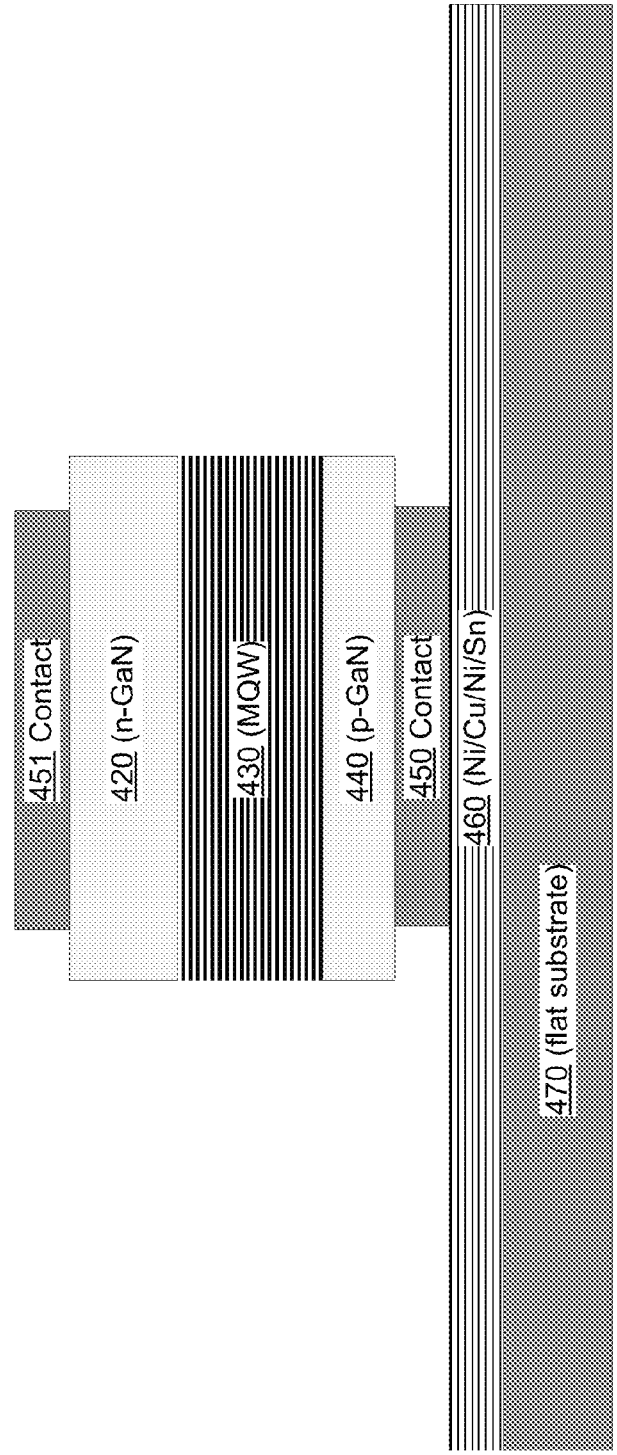
Figure 4I:
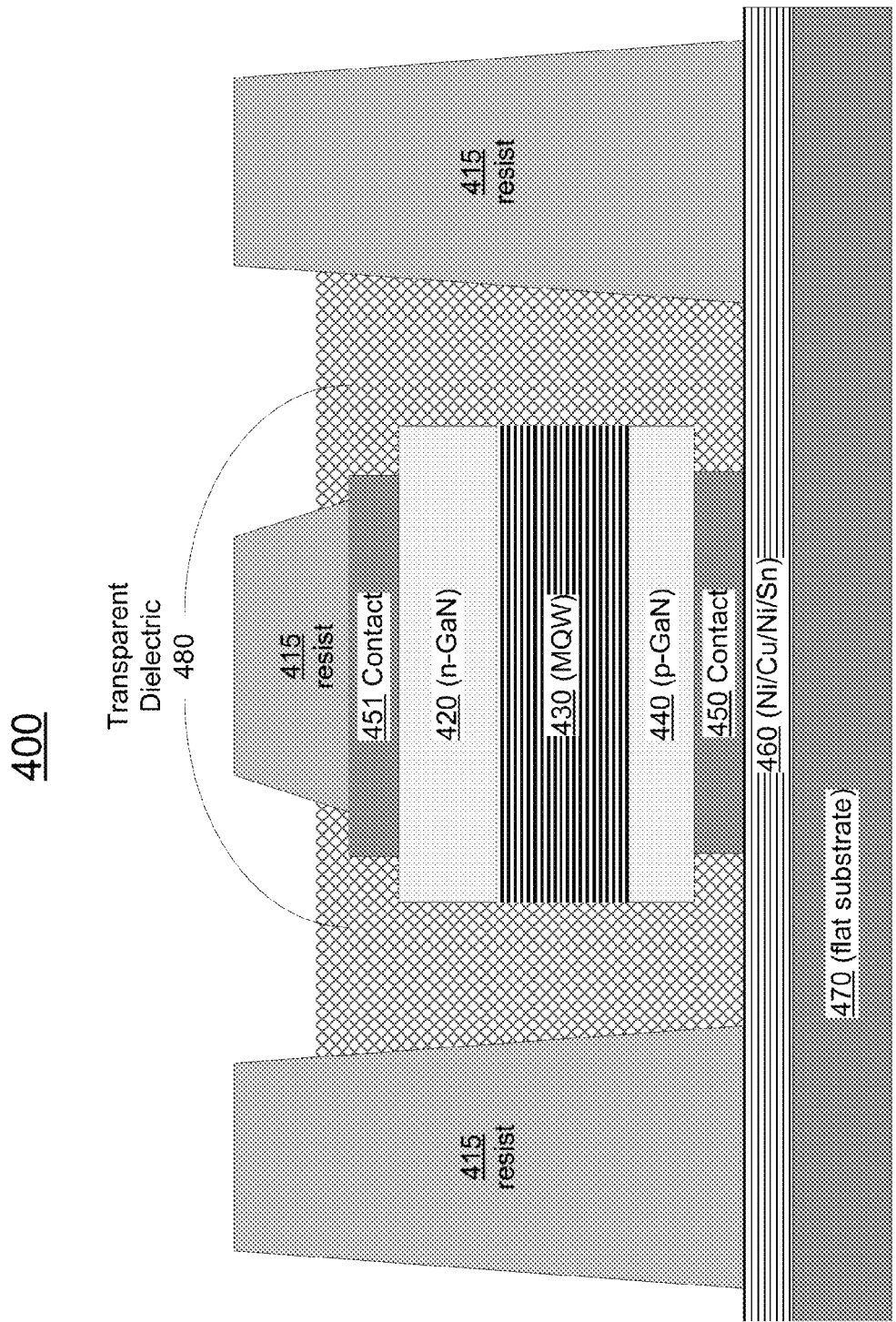
Figure 4J:
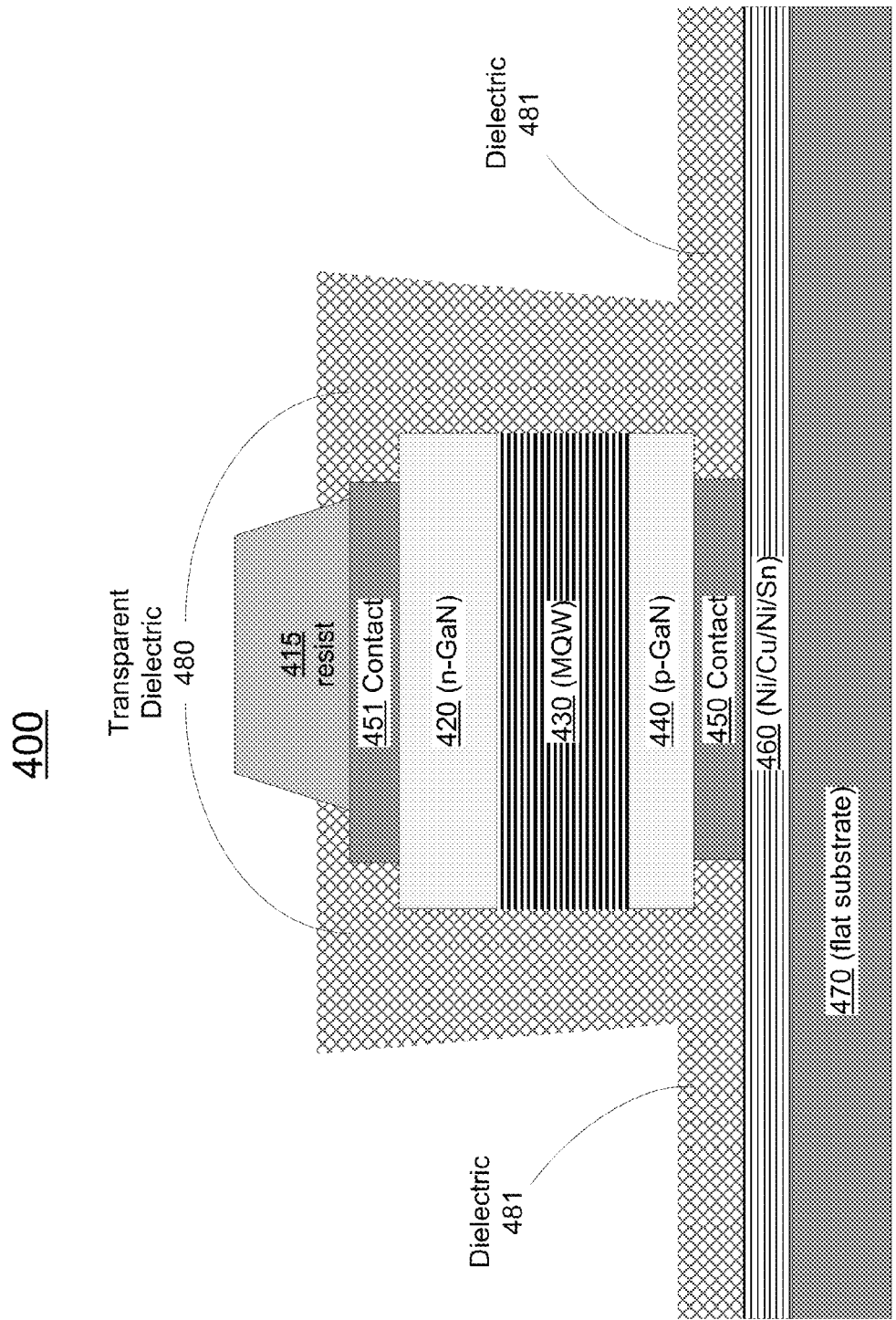
Figure 4K:
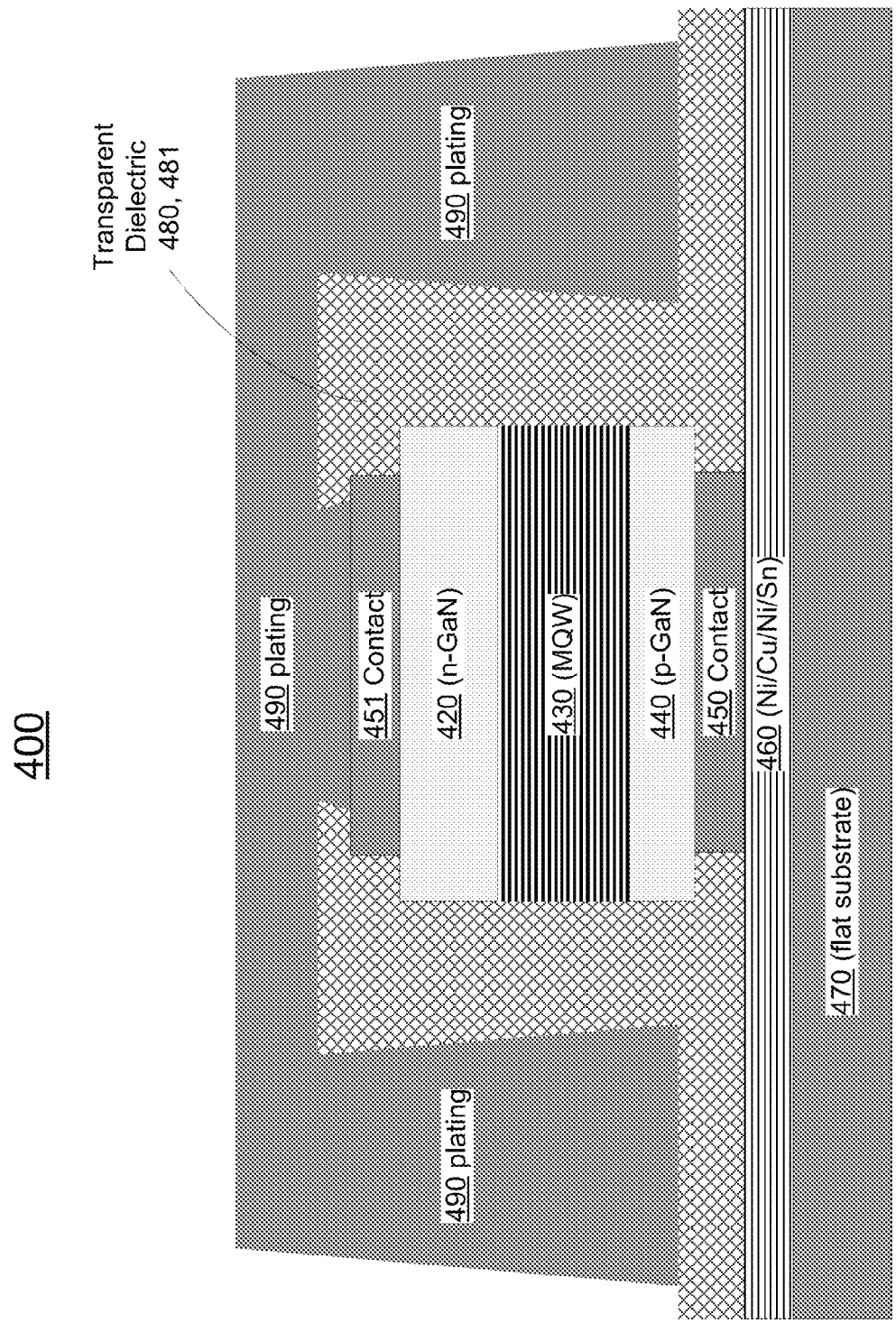
Figure 4L:
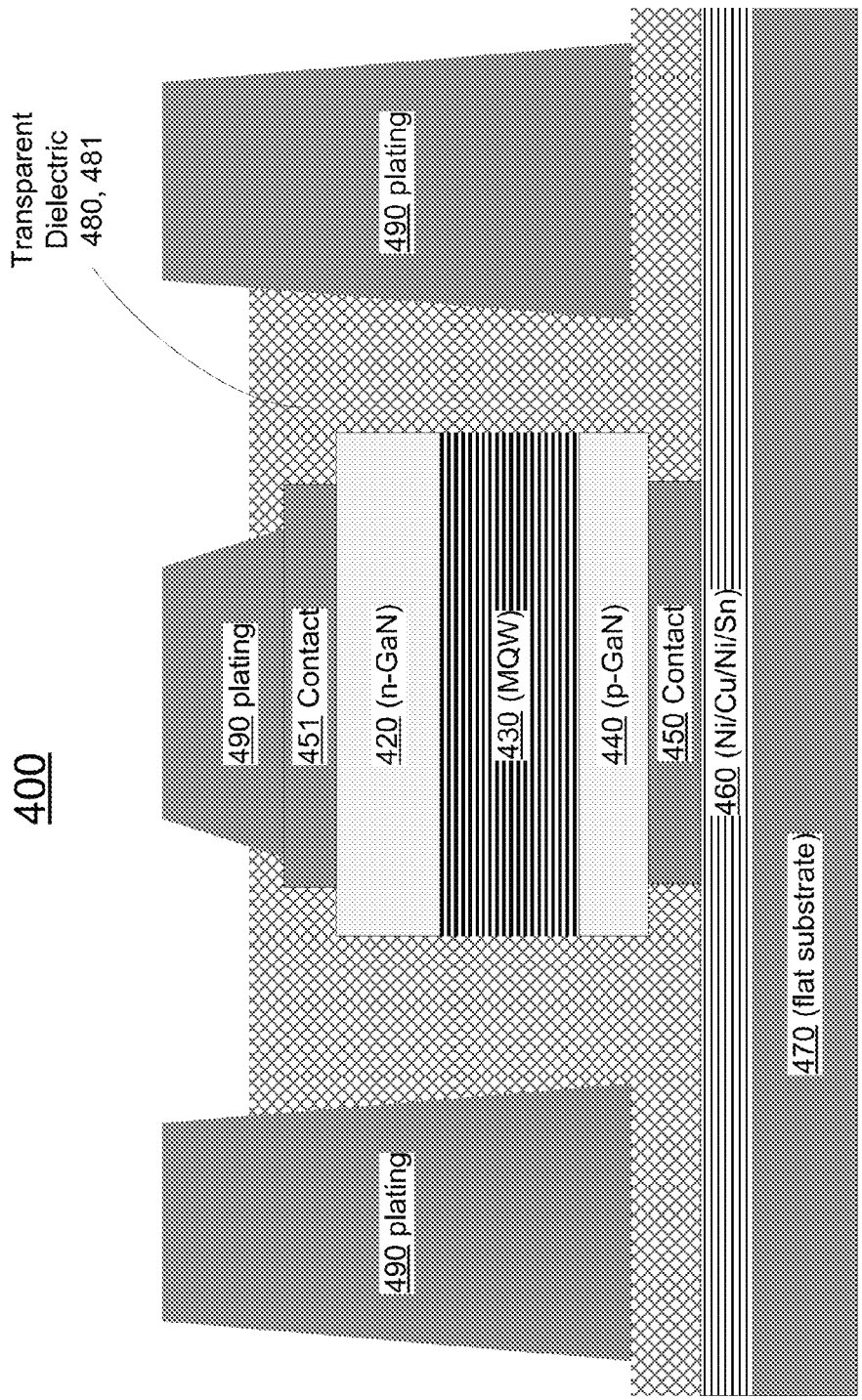
Figure 4M:
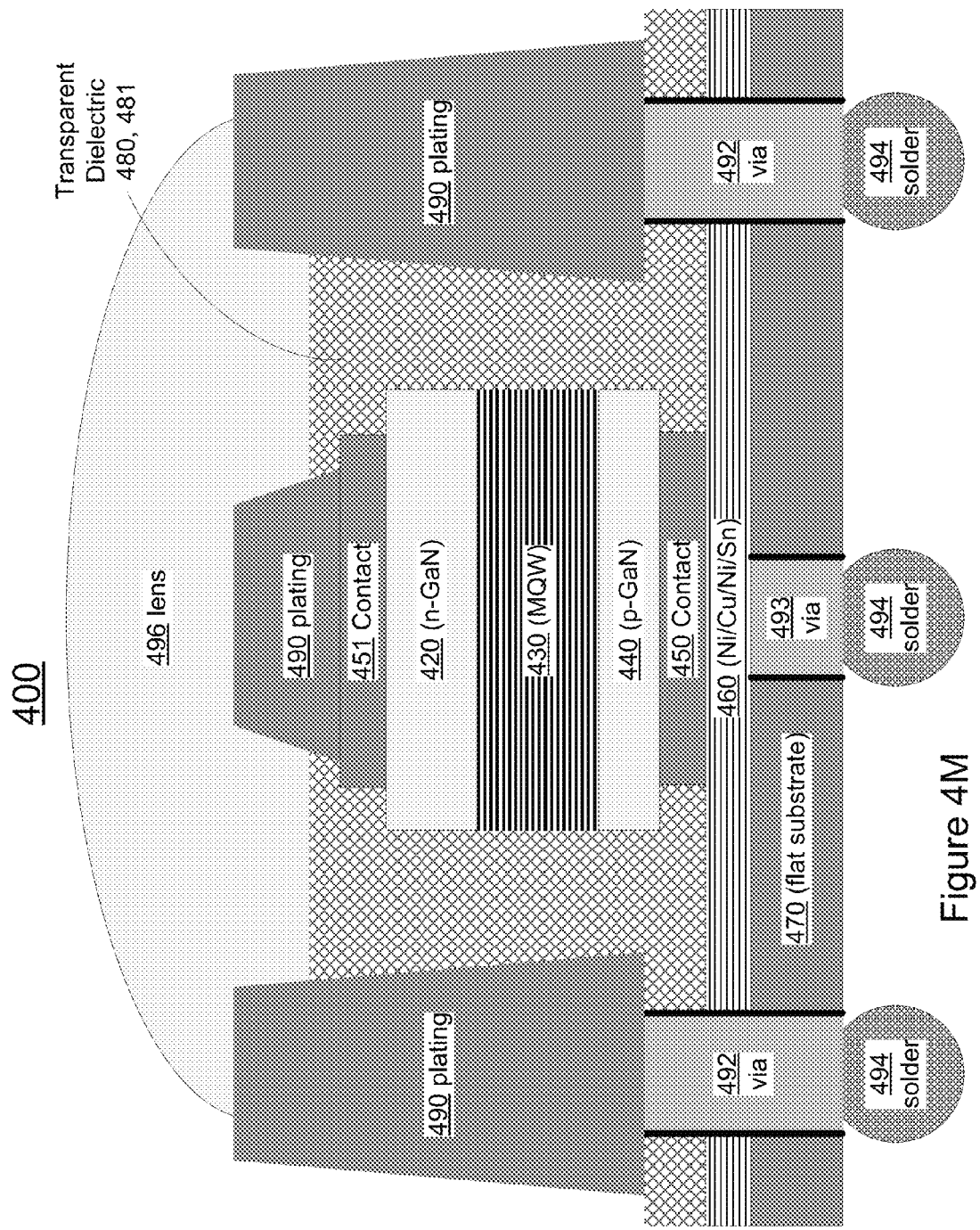
Figure 4N:
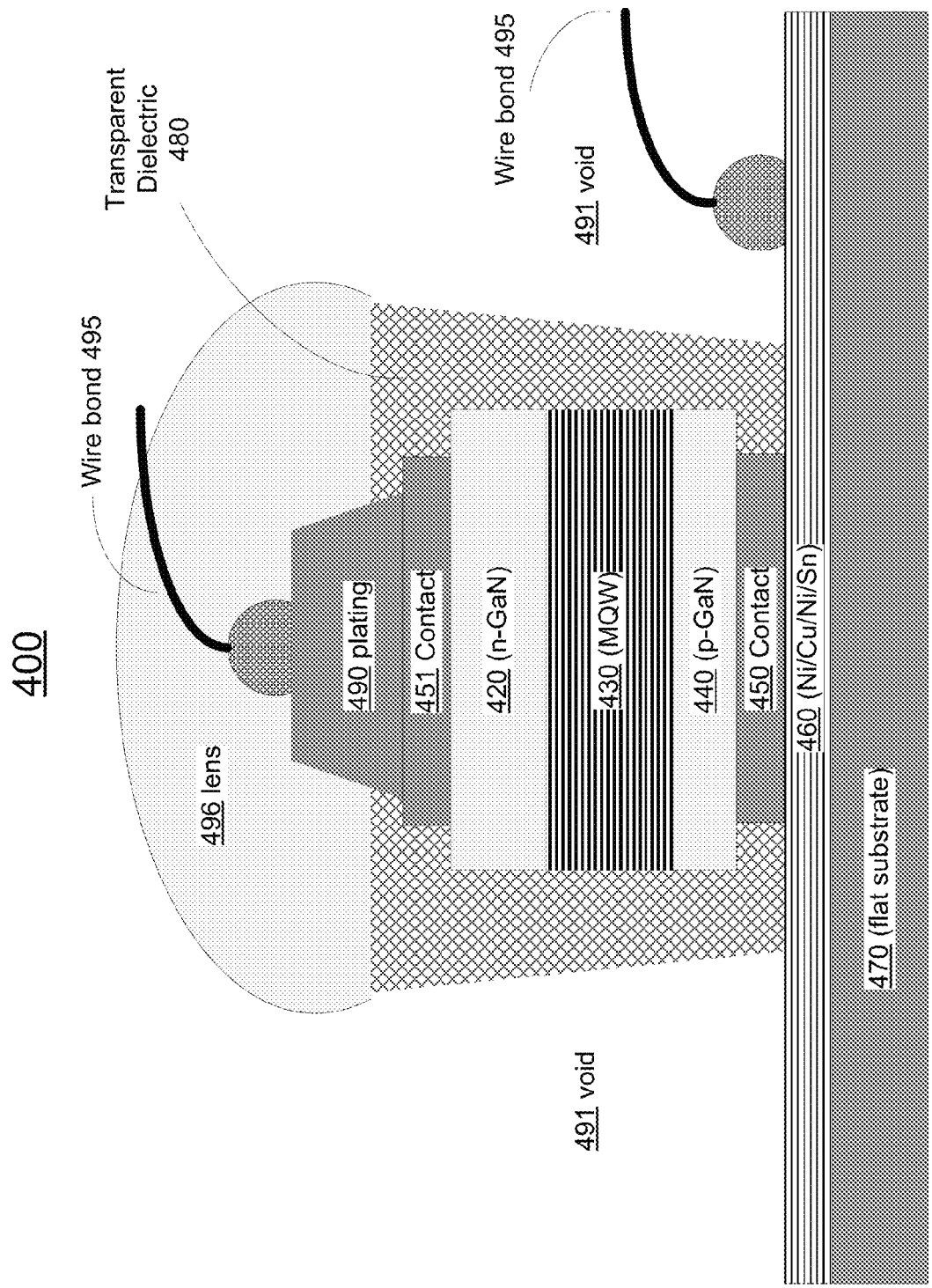

FIGS. 4A through 4N illustrate exemplary sub-assemblies of, and an exemplary process 400 for forming a parallel plate slot emission array, in accordance with embodiments of the present invention.

As illustrated in FIG. 4A, a gallium nitride (GaN) multiple quantum well (MQW) light emitting diode is formed on a sapphire ($\alpha$-$Al_2O_3$) substrate 410, via any suitable process and materials. For example, an n-type layer 420 of gallium nitride (GaN) is formed on substrate 410. A five-period multiple quantum well structure 430 comprising a 2.5 nm thick 85% gallium, 15% indium nitride layer alternating with a 11 nm thick GaN layer is formed on an n-type layer 420. A p-type layer 440 is formed on top of the MQW 430. As is typical, the diode structure is formed continuously over substantially all of the sapphire substrate, although this is not required. It is to be appreciated that embodiments in accordance with the present invention are well suited to other types of light emitting diodes comprising different materials.

FIG. 4B illustrates an isolation of individual light emitting diode devices, of any suitable size via any suitable process. For example, a mesa of about 350 μm on each side is formed via inductively coupled plasma reactive ion etching (RIE) or other suitable process. It is appreciated that more than the illustrated one light emitting diode device may be formed in this manner, and that a plurality of individual light emitting diode devices may remain on substrate 410.

It is appreciated that isolation of individual light emitting diode devices, e.g., as described above, generally results in a square or rectangular shaped LED in plan view, e.g., as illustrated in plan view 442. For a variety of reasons, including, e.g., scribing and/or breaking a substrate, handling, yield and compatibility with higher level packaging, square or rectangular shaped LEDs are standard in the industry. However, the electric field is concentrated around the corners of such square or rectangular devices, resulting in a less than optimal, non-uniform electric field distribution. This effect is more significant for small-area devices.

Accordingly, a circular, in plan view, LED is more desirable, in consideration of uniformity of electric field distribution. However, forming circular LEDs may be considered wasteful, e.g., the irregular areas between such circles may be considered waste, detrimentally reducing an amount or area of devices yielded per wafer.

In accordance with embodiments of the present invention, individual light emitting diode devices may be individualized, e.g., as described in FIG. 4B, into shapes, in plan view, with interior angles greater than 90 degrees, e.g., into hexagons, as illustrated in plan view 441, or into octagons, as illustrated in plan view 443. It is appreciated that such shapes may be closely packed. Because the corners of such shapes are less "sharp" than those of a rectangle, electric field distribution is desirably more uniform in such "non-rectangular" devices than under the convention art.

Because reflecting surfaces are included in packaging of side emitting light emitting diodes, e.g., as described above with respect to FIGS. 1A, 1B and FIG. 3, above, or FIGS. 4C-4N below, embodiments in accordance with the present invention are well suited to such novel plan-view shapes for LEDs. For example, slots 220 (FIG. 2B) and reflectors 160, 165 and/or 170 (FIGS. 1A, 1B) reflectors 340, 350 (FIG. 3), external reflectors 490 (FIG. 4M) or internal reflectors 491 (FIG. 4N) may be formed with compatible shapes around hexagonal or octagonal LEDs, in accordance with embodiments of the present invention.

It is appreciated that the shape and location of reflectors and/or slots need not correspond to the shape of an LED. For example, a square pattern of slots and reflectors may be utilized with a hexagonal LED, in accordance with embodiments of the present invention.

FIG. 4C illustrates an addition of a contact layer 450 to the p-GaN layer 440. Any suitable process and materials may be used, for example, sputtering or e-beam deposition of 20 nm of nickel (Ni), 20 nm palladium (Pd) and 100 nm of gold (Au), followed by annealing in an oxygen ($O_2$) atmosphere at about 550° C. for about five minutes.

FIG. 4D illustrates formation of a mounting plate 405, in accordance with embodiments of the present invention. Flat substrate 470 may comprise a silicon (Si) wafer or copper (Cu) plate, for example. Flat substrate 470 is plated with contact layer 460 comprising nickel (Ni), copper (Cu), nickel (Ni) and tin (Sn), via any suitable process. For example, a seed layer of nickel (Ni) may be deposited by sputtering, e-beam deposition or electroless plating, and the subsequent layers electroplated.

FIG. 4E illustrates the attachment of a plurality of individual light emitting diode devices, e.g., as formed on substrate 410, to mounting plate 405. For example, contact layer 450 is bonded to contact layer 460 via any suitable process. FIG. 4F illustrates the removal of substrate 410 from the plurality of individual light emitting diode devices. Any suitable process, for example, a laser lift off process, may be utilized to remove substrate 410.

FIG. 4G illustrates the formation of a contact layer 451 on the layer 420 on the plurality of individual light emitting diode devices.

FIG. 4H illustrates formation of photoresist structures 415 on the plurality of light emitting diode devices and in between plurality of light emitting diode devices. The photoresist structures 415 may be about 25-100 μm in height. The photoresist structures 415 should be substantially co-planar at their tops. The photoresist structures 415 are generally trapezoidal in shape.

As illustrated in FIG. 4I, a transparent dielectric material 480 is filled into the volume between the plurality of light emitting diode devices and the photoresist structures 415. As illustrated in FIG. 4J, the photoresist structures 415 not on top of a light emitting diode are removed. Additional dielectric material 481 is added to coat exposed portions of contact layer 460. Dielectric material may be transparent, but that is not required.

It is appreciated that the transparent dielectric 480 may be formed with an edge profile suitable for total internal reflection, as described with respect to FIG. 1B. For a total internal reflection embodiment of method 400, the void from removal of resist 415 on the edges of dielectric 480 may not be plated, as illustrated in FIG. 4K, below.

In FIG. 4K, the remaining photoresist 415 on top of the light emitting diodes is removed. Plating 490, e.g., copper (Cu), is plated and patterned. It is to be appreciated that FIG. 4K illustrates a side section of a parallel plate slot emission array generally corresponding to a non-slotted portion of plate 210 (FIG. 2A). The plating pattern illustrated in FIG. 4K enables plating 490 to couple to contact 451.

FIG. 4L illustrates a different section of a parallel plate slot emission array. FIG. 4L generally corresponds to a slotted portion of plate 210 (FIG. 2A). While the lack of plating over the transparent dialectic 480 appears to electrically isolate the three illustrated portions of plating 490 (in this view), the gaps in plating 490 allow light from the light emitting diode (420-440) to escape. The plating structure illustrated in FIG. 4K provides electrical and thermal conduction with the light emitting diode.

FIG. 4M illustrates an exemplary final assembly of a parallel plate slot emission array, in accordance with embodiments of the present invention. FIG. 4M illustrates a side sectional view, comparable to the section illustrated in FIG. 4L. FIG. 4M illustrates the addition of vias 492 from plating 490 to the bottom of flat substrate 470, and via 493 from the contact layer 460 to the bottom of flat substrate 470. For example, via 493 couples to the anode of the light emitting diode device, while vias 492 couple to the cathode of the light emitting diode device, e.g., via plating not shown in this sectional view, but illustrated in FIG. 4K. The addition of optional solder balls 494 and an optional lens and/or phosphor 496 are further illustrated.

It is appreciated that a packaged light emitting diode, e.g., suitable for mounting on a second level electronic assembly, e.g., a printed wiring board, may be known as or referred to as a light emitting diode, even though the package may comprise more than one individual light emitting diode. It is necessary to understand the context of the term's usage in order to understand which meaning of the term is being meant.

It is to be appreciated that a single instance of a light emitting diode device and associated other structures, as illustrated in, e.g., FIG. 4M, may be singulated from other such instances to form a packaged light emitting diode, suitable for mounting on a second level electronic assembly, e.g., a printed wiring board. Alternatively, more than one light emitting diode device and associated other structures may remain physically coupled to form a light emitting diode, comprising multiple individual LEDs in a single package, with greater light output and/or a greater range of spectral emissions.

It is also to be appreciated that the embodiment of FIG. 4M generally corresponds to the embodiment(s) of FIG. 1A and/or FIG. 1B. For example, plating 490 generally corresponds to sheet 140 (FIG. 1A). Plating 490 also serves a role comparable to reflectors 160 and 165. Mounting plate 405, comprising flat substrate 470 and contact layer 460, generally corresponds to sheet 120 (FIG. 1A).

FIG. 4N illustrates an exemplary final assembly of a parallel plate slot emission array, in accordance with embodiments of the present invention. FIG. 4N illustrates a side sectional view, comparable to the section illustrated in FIG. 4M. In the embodiment of FIG. 4N, electrical coupling of the anode and cathode are via wire bonds 495. Dielectric 481 is not applied, leaving contact layer 460 available for wire bonding. Another wire bond is coupled to the contact layer 451. Alternatively, a wire bond contact may be made directly with contact layer 451.

In addition, FIG. 4N illustrates a total internal reflection embodiment of a parallel plate slot emission array, in accordance with embodiments of the present invention. For example, light emitted from the MQW 430 region is internally reflected at the interface between transparent dielectric 480 and void 491.

It is appreciated that embodiments in accordance with the present invention make electrical contact with a plurality of light emitting diode devices at either end of the light emitting diode devices. In contrast, under the conventional art, a light emitting diode typically brings both anode and cathode to the same side of the device. In general, deleterious additional structures, e.g., insulated vias and/or stair-step structure, are required to couple one electrode to the opposite side of the device. Such structures may add to the cost and complexity of manufacture, and may hinder, e.g., obscure, light emission. Embodiments in accordance with the present invention eliminate a need for such structures, advantageously simplifying manufacturing processes and beneficially improving electrical, thermal and light efficiency.

Figure 5:
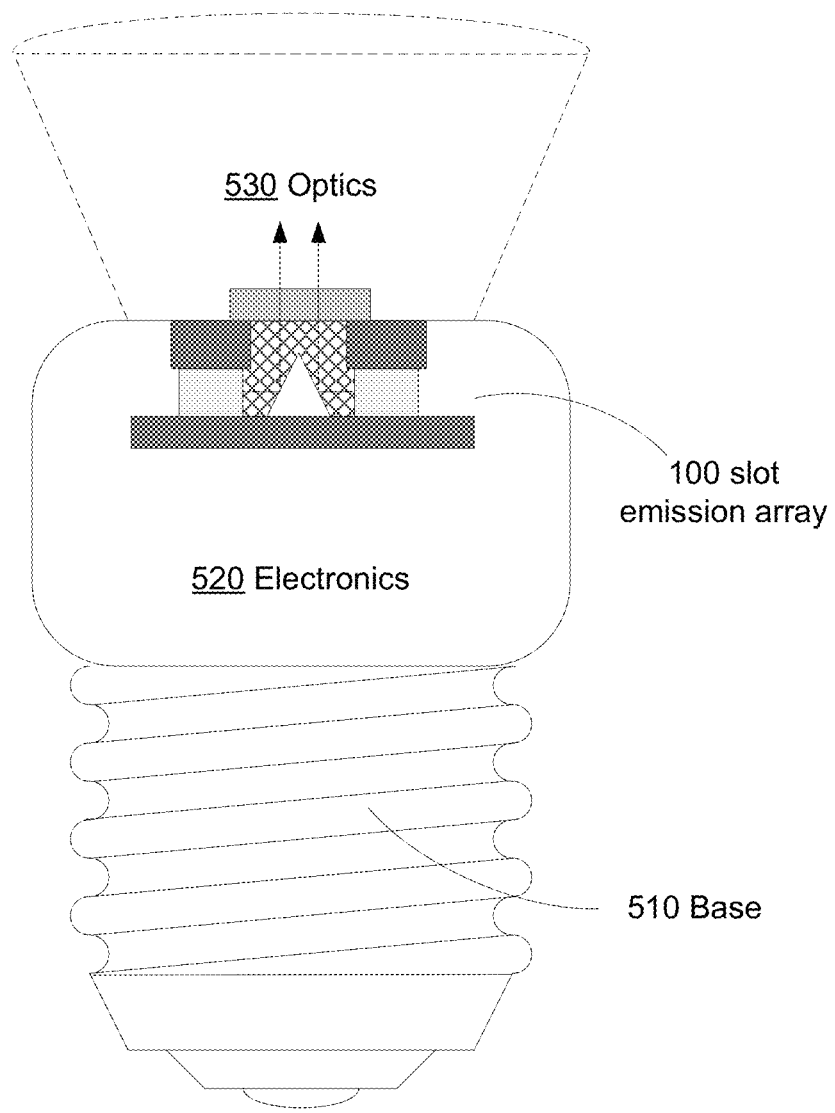
FIG. 5 illustrates an example of an application of a parallel plate slot emission array, in accordance with embodiments of the present invention.

FIG. 5 illustrates an example of an application of parallel plate slot emission array 100, in accordance with embodiments of the present invention. Light appliance 500 is well suited to a variety of lighting applications, including domestic, industrial and landscape lighting. Light appliance 500 is also well suited to stage or theatrical lighting. Light appliance 500 comprises a base 510. As illustrated, base 510 is an Edison type base. It is appreciated that embodiments in accordance with the present invention are well suited to other types of bases, including, for example, GU, bayonet, bipin, wedge, stage pin or other types of bases.

Light appliance 500 additionally comprises a body portion 520 that houses power conditioning electronics (not shown) that convert 110 V AC input electrical power (or 220 V AC, or other selected input electrical power) to electrical power suitable for driving a plurality of light emitting diode devices 540. Body portion 520 may also comprise, or couple to, optional heat sink features (not shown).

Light appliance 500 may additionally comprise optional optics 530. Optics 530 comprise diffusers and/or lenses for focusing and/or diffusing light from the plurality of light emitting diode devices 540 into a desired pattern. It is appreciated that the elements of parallel plate slot emission array 100 direct light in an "upward" direction, and do not require reflectors external to the array package.

Light appliance 500 comprises a plurality of light emitting diode devices. Individual LEDs of plurality of light emitting diode devices may correspond to assemblies previously described herein. For example light appliance 500 may include one or more instances of a parallel plate slot emission array 100. Each instance of a parallel plate slot emission array 100 may comprise one or more light emitting diodes. It is appreciated that not all instances of parallel plate slot emission array 100 need be identical, and that not all light emitting diodes in a single instance of parallel plate slot emission array 100 need be identical.

It is to be further appreciated that appliance 500 may comprise a plurality of individual, different, LED devices mounted on a plurality of parallel plate slot emission arrays 100. For example, one instance of an electronic device may be a blue light emitting diode comprising a sapphire substrate. Another instance of an electronic device may be a green light emitting diode comprising a gallium phosphide (GaP) substrate. Another instance of an electronic device may be a red light emitting diode comprising a gallium arsenide (GaAs) substrate. The three instances of electronic devices may be arranged on a plurality of parallel plate slot emission arrays 100 such that the light from such three colors may be combined to produce a variety of spectral colors. For example, a plurality of light emitting diode devices may operate in combination to produce a "white" light output.

In accordance with embodiments of the present invention, device 500 may include additional electronics associated with the LED devices. In one exemplary embodiment, such additional electronics may comprise circuits to implement a white balance among tri-color LEDs.

Embodiments in accordance with the present invention provide systems and methods parallel plate slot emission arrays. In addition, embodiments in accordance with the present invention provide systems and methods parallel plate slot emission arrays that provide for improved thermal management. Additional embodiments in accordance with the present invention provide for systems and methods for parallel plate slot emission arrays that provide for improved electrical field distribution. Further, embodiments in accordance with the present invention provide systems and methods for parallel plate slot emission arrays that are compatible and complementary with existing systems and methods of integrated circuit design, manufacturing and test.

Various embodiments of the present invention are thus described. While the present invention has been described in particular embodiments, it should be appreciated that the invention should not be construed as limited by such embodiments, but rather construed according to the below claims.

What is claimed is:

1. A method comprising:
   first attaching a plurality of side-emitting light emitting diodes to a first plate;
   second attaching said plurality of side-emitting light emitting diodes to a second plate;
   creating a pattern of reflective surfaces between said first and second plates; and
   removing a substrate connected to the first plate attached to said plurality of side-emitting light emitting diodes;
   wherein said reflective surfaces are configured to reflect light from said plurality of side-emitting light emitting diodes through at least one of said plates, and
   wherein said first and second attaching and said creating form a light emitting diode apparatus.

2. The method of claim 1 further comprising adding a transparent dielectric between said first and second plate.

3. The method of claim 1 wherein said pattern of reflective surfaces comprises a material of lower index of refraction than said transparent dielectric.

4. The method of claim 1 wherein an interface between said pattern of reflective surfaces and said transparent dielectric is configured to cause total internal reflection of said light.

5. The method of claim 1 wherein said side-emitting light emitting diodes emit light from more than two sides, and wherein said reflective surfaces reflect light from all of said sides.

6. The method of claim 1 wherein said removing comprises a laser lift off process.

7. The method of claim 1 wherein said first attaching comprises a low melting point metal solder.

8. The method of claim 1 wherein said first plate comprises copper (Cu).

9. The method of claim 1 further comprising singulating said light emitting diode apparatus.

10. The method of claim 1 further comprising:
    coupling said light emitting diode apparatus to a mounting base to form a light appliance.

11. The method of claim 10 further comprising:
    coupling said plurality of side-emitting light emitting diodes to electronics to convert alternating current for use by said plurality of side-emitting light emitting diodes.

12. A method comprising:
    first attaching a plurality of side-emitting light emitting diodes to a first plate;
    second attaching said plurality of side-emitting light emitting diodes to a second plate;
    creating a pattern of reflective surfaces between said first and second plates; and
    forming a plurality of slots in said first plate;
    wherein said first and second attaching and said creating form a light emitting diode apparatus; and
    wherein said reflective surfaces are configured to reflect light from said plurality of side-emitting light emitting diodes through at least one of said plates and through said plurality of slots.

13. A method comprising:
    forming a light emitting diode structure on a substrate;
    etching portions of said a light emitting diode structure to form a plurality of individual light emitting diode devices;
    forming a first contact layer on the top of said plurality of individual light emitting diode devices;
    forming a second contact layer on a flat substrate;
    attaching said second contact layer to said first contact layer;
    removing said substrate from said plurality of individual light emitting diode devices;
    forming a third contact layer opposite said first contact layer on said plurality of individual light emitting diode devices;
    patterning first photoresist onto said third contact;
    patterning second photoresist in regions between said plurality of individual light emitting diode devices; and filling regions between said plurality of individual light emitting diode devices and said second photoresist with a transparent dielectric material.

14. The method of claim 13 further comprising wire bonding to said first and third contact layers.

15. The method of claim 13 further comprising:
removing said second photoresist;
adding dielectric material on exposed portions of said a second contact layer;
removing said first photoresist;
plating said third contact and exposed dielectric material, leaving gaps for light to escape.

16. The method of claim 13 further comprising:
forming first vias through said dielectric material, said second contact layer and said flat substrate to said plating.

17. The method of claim 13 further comprising:
forming second vias through said flat substrate to said second contact layer.

18. The method of claim 17 further comprising: adding solder to said first and second vias.

19. The method of claim 13 further comprising: adding a lens over said gaps.

20. The method of claim 13 further comprising: adding a phosphor over said gaps.

21. The method of claim 13 further comprising:
coupling said plurality of individual light emitting diode devices to a mounting base to form a light appliance.

\* \* \* \* \*